(12) United States Patent
Oki

(10) Patent No.: US 8,701,429 B2
(45) Date of Patent: Apr. 22, 2014

(54) AIR CONDITIONING SYSTEM

(75) Inventor: Junichi Oki, Azumino (JP)

(73) Assignee: GAC Corporation, Nagano (JP)

( * ) Notice: Subject to any disclaimer, the term of this patent is extended or adjusted under 35 U.S.C. 154(b) by 672 days.

(21) Appl. No.: 12/956,801

(22) Filed: Nov. 30, 2010

(65) Prior Publication Data

US 2011/0185750 A1 Aug. 4, 2011

(30) Foreign Application Priority Data

Jan. 29, 2010 (JP) .................................. 2010-18892

(51) Int. Cl.
*F25D 17/04* (2006.01)

(52) U.S. Cl.
USPC .............................................. 62/181; 62/183

(58) Field of Classification Search
USPC ....... 62/89, 181, 183, 186, 332, 333, DIG. 22
See application file for complete search history.

(56) References Cited

U.S. PATENT DOCUMENTS 4,285,027 A * 8/1981 Mori et al. .................... 361/698

FOREIGN PATENT DOCUMENTS

| JP | 2002277001 A | 9/2002 |
| JP | 2002-333237 A | 11/2002 |
| JP | 2003148838 A | 5/2003 |

* cited by examiner

*Primary Examiner* — Marc Norman
(74) *Attorney, Agent, or Firm* — Blank Rome LLP

(57) ABSTRACT

A supplementary air conditioning system includes an indoor heat exchanger and an outdoor heat exchanger. The indoor heat exchanger is fanless and includes indoor tubes installed so as to be inclined to a ceiling of a room. The indoor tubes make diagonal contact with a high-temperature air zone in an upper part of the room and refrigerant inside the indoor tubes is heated by the air zone so as to boil and vaporize and air in the air zone flows down through the indoor heat exchanger. The external heat exchanger includes outdoor tubes installed outside at a higher position than the indoor tubes and are connected to the indoor tubes via connecting pipes with no compressor therebetween. The outdoor tubes condense and liquefy the refrigerant boiled and vaporized in the indoor tubes and return the refrigerant to the indoor tubes.

9 Claims, 4 Drawing Sheets

Temperature difference between input air
and output air of indoor heat exchanger $\Delta T1$ (°C)

Temperature of indoor heat exchanger
(refrigerant evaporation temperature) T2 (°C)

AIR CONDITIONING SYSTEM

CROSS-REFERENCE TO RELATED APPLICATION

This application is based upon and claims the benefit of priority from the prior Japanese Patent Application No. 2010-18892, filed Jan. 29, 2010, the entire contents of which are incorporated herein by reference.

TECHNICAL FIELD

The present invention relates to an air-conditioning system with low power consumption.

BACKGROUND

Japanese Laid-Open Patent Publication No. 2002-277001 discloses a method where a heat exchanger unit is installed to supplement the existing cooling performance of a room and thereby improve total cooling performance, which includes an improvement in the local cooling performance of air conditioners and cooling fans provided in information equipment. By using this method, it is possible to integrally provide the additional cooling performance required to cool information equipment integrally to the information equipment and air conditioners themselves, thereby minimizing the modification work required on existing equipment.

SUMMARY

At an information-related facility such as a data center where a large amount of information equipment such as servers is installed, in most cases air conditioning equipment is in operation twenty-four hours a day, three hundred and sixty-five days a year regardless of day and night and the four seasons. Most of the time, the air-conditioning equipment at an information-related facility operates to cool the interior. It is therefore important to improve cooling performance and to also reduce the power consumed by cooling.

One aspect of the present invention is a system including an indoor heat exchanger and an outdoor heat exchanger. The indoor heat exchanger is fanless but includes an indoor tube installed so as to be inclined to the horizontal. Refrigerant inside the indoor tube is heated by a high-temperature air zone in a room (interior) so as to boil and vaporize, while air in the high-temperature air zone flows down through the indoor heat exchanger. The outdoor heat exchanger includes an outdoor tube that is installed outside and at a higher position than the indoor tube. The outdoor tube is connected to the indoor tube via connecting pipes with no compressor being interposed therebetween, condenses and liquefies the refrigerant that boiled and vaporized at the indoor tube, and returns the refrigerant to the indoor tube.

This system does not include a compressor but this system has the outdoor tube disposed higher than the indoor tube so that the refrigerant circulates naturally due to the difference in specific gravity between vaporized refrigerant and liquefied refrigerant, thereby producing a low-energy system that is able to cool the room when the outdoor (outside) temperature is lower than indoor (inside) temperature. The refrigerant inside the indoor tube is heated by the high-temperature air zone so as to boil and vaporize, while air in the high-temperature air zone is cooled and flows downward through the indoor heat exchanger. Accordingly, it is possible to omit an interior fan.

In this system, the indoor tube is disposed non-horizontally that includes being disposed vertically. In this system, the indoor tube should preferably be disposed so as to be inclined (non-perpendicularly) to the horizontal and in addition the indoor tube should preferably be disposed so as to be near the ceiling of the room and inclined with respect to the ceiling. By disposing the indoor tube near the ceiling and inclined to the horizontal or to the ceiling, the indoor tube will make diagonal contact with the high-temperature air zone across the ceiling in the upper part of the room. By doing so, air in the high-temperature air zone near the ceiling is cooled and flows downward through the indoor heat exchanger unit more efficiently. Accordingly, it is easy to form a down flow and to improve the cooling efficiency of the room even when an interior fan is omitted. Even if the indoor tube is inclined without being vertical, it is possible for the refrigerant to circulate effectively on a route where refrigerant that has condensed and liquefied is supplied to a lower end of the indoor tube and refrigerant that boiled and vaporized is discharged from the upper end of the indoor tube. Accordingly, it is possible to provide an indoor heat exchanger that has favorable cooling efficiency using natural circulation.

The system is capable of cooling a room when the temperature outside is lower than the temperature inside, but does not have a great effect in improving the cooling performance of the data center, for example, the peak cooling performance. However, since a compressor or interior fan is not necessary, a cooling effect is achieved using little power or without using power at all. This means it is possible to reduce the power consumption needed by air conditioning that runs twenty-four hours a day, three hundred and sixty-five days a year.

The indoor heat exchanger is capable of being disposed at an air intake of a floor-standing air conditioner installed on a floor of the room, or on an air path to the air intake. This makes it possible to reduce the air conditioning load of the floor-standing air conditioner and thereby reduce the power consumption of the air conditioner.

The indoor heat exchanger may be connected to the air intake of the floor-standing air conditioner via a duct. When the indoor tube is cooling condition, a down flow is formed by the indoor tube that is inclined. Accordingly, even when the floor-standing air conditioner and the indoor heat exchanger are connected via a duct, increasing of pressure drop at the air conditioner is avoidable.

The system may include an outdoor fan that forcibly supplies outdoor air to the outdoor tube but does not need to include an outdoor fan. A system that includes an outdoor fan should preferably further include a control unit that controls the operation of the outdoor fan. The control unit should preferably include a functional unit (function) that evaluates a heat absorbing capability (cooling performance) of the indoor tube when the outdoor fan is stopped by one of temporarily stopping the outdoor fan and temporarily running the outdoor fan. In addition, the control unit should preferably further include a functional unit that stops the outdoor fan when the heat absorbing capability of the indoor tube when the outdoor fan is stopped is not inferior to the heat absorbing capability of the indoor tube when the outdoor fan is running. By doing so, it is possible to further reduce the power consumed by the outdoor fan.

Also, the control unit should preferably further include a functional unit that stops the outdoor fan when a difference in power consumption of an air conditioner installed in the room due to a difference between the heat absorbing capability of the indoor tube when the outdoor fan is stopped and the heat absorbing capability of the indoor tube when the outdoor fan is running is less than power consumption of the outdoor fan.

By doing so, it is possible to reduce power consumption relative to the cooling performance of the entire system that includes the air conditioner.

Another aspect of the present invention is a method of controlling a system. The system includes an indoor tube, an outdoor tube, an outdoor fan, and a control unit that controls the outdoor fan. The indoor tube is installed so as to be inclined to the horizontal, and refrigerant inside the indoor tube is heated by an air zone in a room so as to boil and vaporize. The outdoor tube is installed outside at a higher position than the indoor tube, is connected to the indoor tube via connecting pipes without a compressor being interposed therebetween, and condenses and liquefies the refrigerant that has boiled and vaporized in the indoor tube and returns the refrigerant to the indoor tube. The outdoor fan forcibly supplies outdoor air to the outdoor tube. The method includes steps of:

1. the control unit evaluating a heat absorbing capability of the indoor tube when the outdoor fan is stopped by one of temporarily stopping the outdoor fan and temporarily running the outdoor fan; and
2. the control unit stopping the outdoor fan if the heat absorbing capability of the indoor tube when the outdoor fan is stopped is not inferior to the heat absorbing capability of the indoor tube when the outdoor fan is running.

The method may further include a step of:
3. the control unit stopping the outdoor fan if a difference in power consumption of an air conditioner installed in the room due to a difference between the heat absorbing capability of the indoor tube when the outdoor fan is stopped and the heat absorbing capability of the indoor tube when the outdoor fan is running is less than power consumption of the outdoor fan.

DETAIL DESCRIPTION

Figure 1:
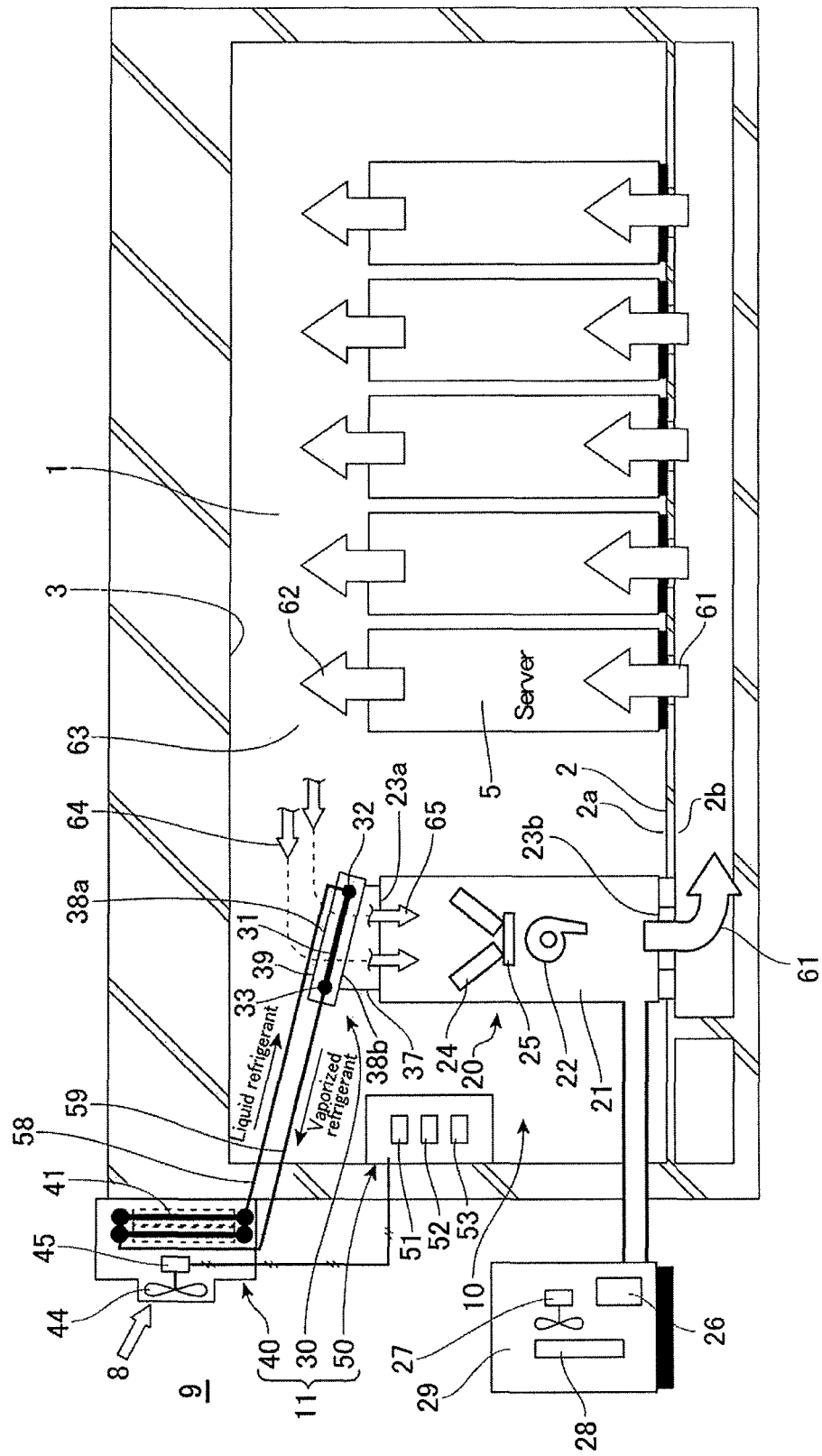
FIG. 1 is a diagram showing an overview of an air conditioning system.

FIG. 1 shows one example of an air conditioning system of a data center. This air conditioning system 10 uses a space of an underfloor 2b of a raised (access) floor 2 that makes a two-level construction including a floor surface 2a and an underfloor 2b, to supply cooling air 61 to a plurality of servers 5 disposed on the floor surface 2a and thereby cool (i.e., control the temperature of) the servers 5 and the room 1. The air conditioning system 10 includes a floor-standing main air conditioning system 20 and a supplementary air conditioning system 11 disposed near the ceiling 3 of the room 1. The main air conditioning system 20 includes a floor-standing indoor (interior) unit 21 and an outdoor unit 29. The indoor unit 21 includes an evaporator including cooling tubes 24, a heater 25, and an interior fan 22. The indoor unit 21 takes in air via an intake 23a at a ceiling side of the indoor unit 21, controls the temperature of the air, and expels air (cooling air) 61 whose temperature has been controlled into the underfloor space 2b from an outtake 23b provided so as to pass through the floor 2. Note that the following description will focus on a cooling operation by the air conditioning system 10.

The outdoor unit 29 includes a compressor 26, an outside fan 27, and a condenser 28 including liquefying tubes. In the main air conditioning system 20, refrigerant that has been compressed by the compressor 26 is cooled by the condenser 28 using the outside air temperature, and by reducing the pressure and causing the refrigerant to evaporate in the evaporator 24 of the indoor unit 21, the cooling air 61 is generated. In the indoor unit 21, the air 65 drawn in from the intake 23a by the interior fan 22 is cooled by the evaporator 24 and the resulting cooling air 61 is expelled to the underfloor space 2b to cool the servers 5. At the servers 5, electronic equipment inside the servers 5 is cooled by the cooling air 61 supplied from the underfloor space 2b and heated air 62 is discharged toward the ceiling 3.

The supplementary air conditioning system 11 includes an indoor heat exchanger (indoor heat exchanger unit) 30 that includes indoor tubes 31 disposed at an angle to the ceiling 3 of the room 1 and an outdoor heat exchanger (outdoor heat exchanger unit) 40 that is outside 9 and includes outdoor tubes 41 installed at a higher position than the indoor tubes 31. The indoor heat exchanger 30 does not include a fan. The outdoor heat exchanger 40 includes an outside fan 44 that forcibly supplies outside air 8 to the outdoor tubes 41, and a fan motor 45 that drives the outside fan 44. In addition, the supplementary air conditioning system 11 includes a control unit 50, which controls the fan motor 45 of the outside fan 44, and connecting pipes (fluidly connecting pipes) 58 and 59 that connect (fluidly connect) the indoor tubes 31 and the outdoor tubes 41 without a compressor being interposed therebetween. The connecting pipe 59 supplies refrigerant that has boiled and vaporized at the indoor tubes 31 to the outdoor tubes 41 and the connecting pipe 58 supplies the refrigerant that has condensed and liquefied at the outdoor tubes 41 back to the indoor tubes 31.

The indoor tubes 31 of the indoor heat exchanger 30 are installed near the ceiling 3 that extends horizontally and the indoor tubes 31 are provided so as to be inclined with respect to the ceiling 3. That is, the indoor tubes 31 are installed so as to be inclined to the horizontal. The indoor heat exchanger 30 includes a supply header 32, to which liquefied refrigerant is supplied, and a discharge header 33 that collects vaporized refrigerant, with the plurality of indoor tubes 31 being connected to both the supply header 32 and the discharge header 33. The discharge header 33 of the indoor heat exchanger 30 is disposed closer to the ceiling 3 than the supply header 32. This means that the plurality of indoor tubes 31 extend diagonally upward from the supply header 32 toward the discharge header 33. The plurality of indoor tubes 31 are inclined to the vertical and not parallel to or perpendicular to the vertical, and are inclined with respect to the ceiling 3. That is, the plurality of indoor tubes 31 are installed directly below the ceiling 3 so as to be inclined to the horizontal without being parallel or perpendicular to the horizontal and the plurality of indoor tubes 31 are installed so as to be inclined with respect to the ceiling 3 that extends horizontally.

The indoor heat exchanger 30 also includes a housing 39, inside which the indoor tubes 31 are disposed, and, in the same way as the indoor tubes 31, the housing 39 is disposed so as to be inclined with respect to the ceiling 3. The upper surface of the housing 39 is a supply opening 38a through which air is supplied to the indoor tubes 31, which means that the supply opening 38a is also inclined with respect to the ceiling 3. That is, the supply opening 38a is inclined with respect to the vertical and the horizontal. The lower surface of the housing 39 is an outtake 38b that discharges air that has been cooled by the indoor tubes 31, with the outtake 38*b* being connected via a duct 37 to the intake 23*a* of the floor-standing indoor unit 21.

In this supplementary air conditioning system 11, the indoor heat exchanger 30 is supported via the duct 37 by the floor-standing indoor unit 21. However, it is also possible to suspend the indoor heat exchanger 30 from the ceiling 3 or to support the indoor heat exchanger 30 from the floor 2 using an appropriate method.

The indoor tubes 31 of the indoor heat exchanger 30 diagonally contact a region along the ceiling 3 of the room 1 (that is, a high-temperature air zone 63 in an upper part of the room 1). The refrigerant inside the indoor tubes 31 is heated by the high-temperature air zone 63 and boils and vaporizes. Since heat is taken from the high-temperature air zone 63, such zone is cooled and air 65 that flows downward (i.e., a down flow) from the region close to the ceiling 3 of the room 1 is produced. This air flow (down flow) 65 flows in a substantially vertical direction. By disposing the indoor tubes 31 so as to be inclined without being horizontal or vertical (perpendicular), it is possible for the indoor tubes 31 to effectively contact the high-temperature air zone 63 that extends horizontally and to effectively produce the down flow 65. In addition, since the indoor tubes 31 are inclined with respect to the ceiling 3, the direction in which air is drawn into the indoor tubes 31 is limited to a direction in which the down flow 65 is not produced, and a certain circulating flow 64 that carries air in the high-temperature air zone 63 across the ceiling 3 and into the indoor heat exchanger unit 30 is produced. This means it is possible to eradicate hot spots formed at upper parts of the servers 5 comparatively easily, to promote heat exchange at the servers 5, and to cool the servers 5 even more effectively.

Accordingly, in the indoor heat exchanger 30, comparatively hot air 64 flows from a substantially horizontal direction across the ceiling 3 into the supply opening 38*a* and cooled air 65 is discharged in a substantially vertical direction from the outtake 38*b*. The air 65 that has been discharged from the indoor heat exchanger 30 is drawn in from the intake 23*a* of the floor-standing indoor unit 21, is cooled further, and then supplied to the servers 5. Accordingly, in a condition where the supplementary air conditioning system 11 is in operation, the load of the main air conditioning system 20 can be reduced, thereby reducing the power consumption of the main air conditioning system 20.

Due to the difference in specific gravity with liquid refrigerant, the refrigerant that has boiled and vaporized in the indoor tubes 31 of the indoor heat exchanger 30 of the supplementary air conditioning system 11 rises within the tubes and is collected in the discharge header 33 disposed at the top, then passes through the connecting pipe 59 and reaches the outdoor heat exchanger unit 40 that is positioned even higher. At the outdoor heat exchanger 40, the vaporized refrigerant that has flowed into the outdoor tubes 41 is cooled by the outside air and condenses and liquefies to become liquid refrigerant. Due to the difference in specific gravity with the vaporized refrigerant, the liquid refrigerant flows downward via the connecting pipe 58 to the supply header 32 of the indoor heat exchanger unit 30 positioned below. In this way, in the supplementary air conditioning system 11, by causing the refrigerant to circulate naturally under gravity due to the difference in specific gravity between liquid refrigerant and vaporized refrigerant without using a compressor or a pump, it is possible to expel heat from the room 1 into the outside air. Accordingly, power (i.e., electricity) for driving a compressor is not required in the supplementary air conditioning system 11.

Typical examples of the indoor tubes 31 and the outdoor tubes 41 are aluminum pipes or copper pipes, and such pipes may be equipped with fins or may be finless. The fins may be corrugated, plate-like, or in the form of spines. The refrigerant may be any refrigerant that vaporizes at room temperature and liquefies at outside air temperature as operating conditions, and as one example, HFC 134a (whose chemical formula is $CH_2FCF_3$) may be used.

In addition, the air flows 64 and 65 in the room 1 produced by the indoor tubes 31 that are disposed at an angle in the supplementary air conditioning system 11 cause the air in the room 1 to circulate and effectively come into contact with the indoor tubes 31. Accordingly, the supplementary air conditioning system 11 does not need an indoor fan and power (i.e. electricity) required by such an indoor fan is not required.

In the supplementary air conditioning system 11, the indoor heat exchanger 30 is connected to the intake 23*a* of the indoor unit 21 of the main air conditioning system 20 by the duct 37 and the power of the fan 22 of the indoor unit 21 is used to ensure that air circulates. However, when the indoor heat exchanger 30 is in operation, the load of the interior fan 22 of the indoor unit 21 is reduced by the down flow 65 produced by the indoor heat exchanger 30.

It is also possible to reduce the cooling load of the main air conditioning system 20 by disposing the indoor heat exchanger 30 of the supplementary air conditioning system 11 on a path taken by room air drawn in by the intake 23*a* of the indoor unit 21 of the main air conditioning system 20 without connecting the indoor heat exchanger unit 30 via the duct 37. It should be noted that the supplementary air conditioning system 11 reduces the thermal load of the room 1 by itself, for example by disposing the indoor head exchangers 30 separately to the indoor unit 21 and distributing the exchangers 30 among a number of locations in the room 1.

In the outdoor heat exchanger 40, while the outside fan 44 that is rotated using the motor 45 is equipped, the outdoor tubes 41 is also cooled using external air (i.e., the wind outside) by stopping the outside fan 44. In particular, when cooling a building erected in a landscape where the wind blows constantly, in many cases there will be no need to drive the outside fan 44 using the motor 45. For example, in an environment where a large number of buildings are erected in a row, a sufficient cooling effect may be obtained by winds that pass between the buildings. If the fan motor 45 is not running, no power (electricity) will be required, which means that the supplementary air conditioning system 11 is capable of cooling the room 1 with fundamentally no power consumption. Accordingly, it is possible to further reduce the power required to cool the room 1 that is used as a data center or the like.

On the other hand, when there is no wind or the force of the wind is insufficient, there are cases where running the motor 45 of the outside fan 44 to make use of the cooling ability of the supplementary air conditioning system 11 will reduce the power consumption of the entire air conditioning system 10. Data centers in particular consume huge amounts of power, resulting in demand for every possible improvement in power consumption. Data centers operate continuously for twenty-four hours a day, three hundred and sixty-five days a year, so that the supplementary air conditioning system (heat-discharging unit, heat-discharging system) 11 will also operate for a considerable time and assists in reducing the power consumption and operating time of the air conditioning system 10. So, any reducing power consumption is important. In addition, in a system operating throughout the year, since the life of the motor 45 is related to the cumulative operating time (normally around 20,000 hours), if the operating time of the fan motor 45 can be suppressed, it will be possible to extend a maintenance cycle that includes replacing the motor, and thereby reduce the cost.

For this reason, the control unit 50 of the supplementary air conditioning system 11 includes a function (evaluation function, evaluation functional unit) 51 for evaluating the performance (i.e., the heat absorbing capability of the internal tubes) when the outside fan 44 is running, and first and second functions (functional units) 52 and 53 that stop (i.e., do not run) the motor 45 of the outside fan 44 under predetermined conditions. The evaluation function 51 temporarily stops the outside fan motor 45 or temporarily runs the outside fan motor 45 and evaluates the cooling performance of the indoor heat exchanger unit 30, that is, the heat absorbing capability of the indoor tubes 31 when the outside fan motor 45 is stopped and that of when the outside fan motor 45 is running. The first stopping function 52 stops the outside fan 44 if the heat absorbing capability of the indoor tubes 31 when the outside fan 44 has stopped is not inferior to the heat absorbing capability of the indoor tubes 31 when the outside fan 44 is running. The second stopping function 53 stops the outside fan 44 (the fan motor 45) if a reduction in power consumption (difference in power consumption) of the main air conditioning system 20 due to a difference between the heat absorbing capability of the indoor tubes 31 when the outside fan 44 is running and the heat absorbing capability of the indoor tubes 31 when the outside fan 44 is stopped is smaller than the power consumption of the motor 45 of the outside fan 44.

Figure 2:
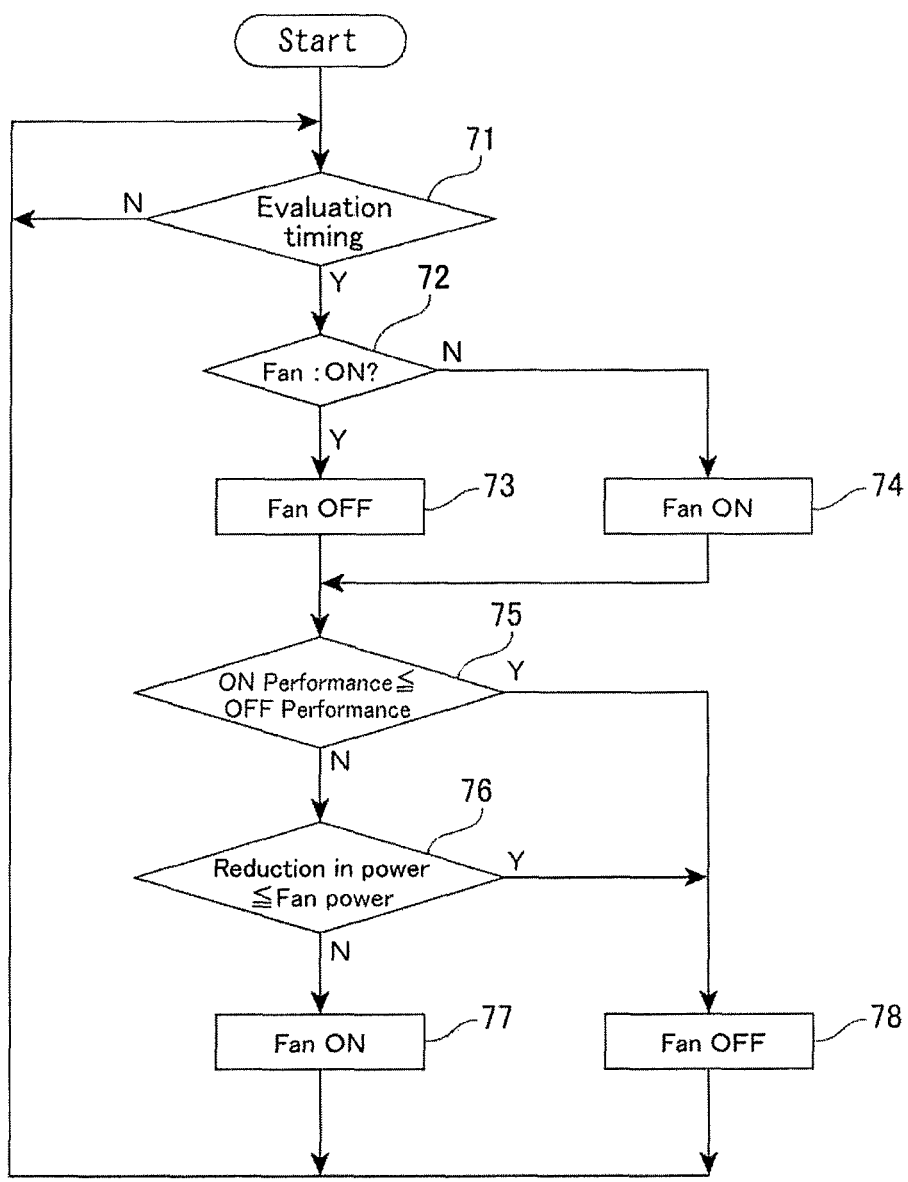
FIG. 2 is a flowchart showing control of the air conditioning system.

FIG. 2 is a flowchart showing the operation of the control unit 50. First, in step 71, the evaluation functional unit 51 judges the evaluation timing. A first method for judging the evaluation timing is whether a predetermined period has passed. Another method for judging the evaluation timing is whether a parameter (measurement value) set in advance for evaluating the performance of the indoor heat exchanger 30 has reached a threshold value.

When the evaluation timing has been reached, in step 72, the evaluation functional unit 51 judges whether the outside fan 44 (the fan motor 45) is running and if the outside fan 44 is running, stops the outside fan 44 in step 73 and evaluates the performance of the indoor heat exchanger 30. That is, the heat absorbing capability of the indoor tubes 31 is evaluated. On the other hand, if the outside fan 44 is stopped, in step 74 the outside fan 44 (the fan motor 45) is run and the heat absorbing capability of the indoor tubes 31 is evaluated.

Figure 3A:
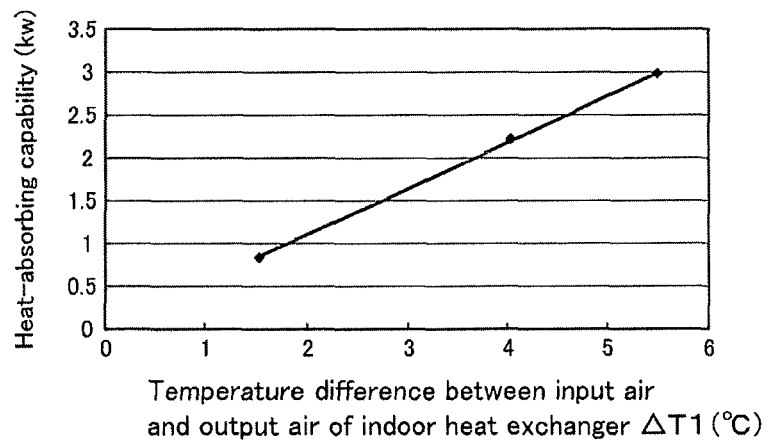
FIG. 3A is a graph showing the relationship between heat-absorbing capability and temperature difference.
Figure 3B:
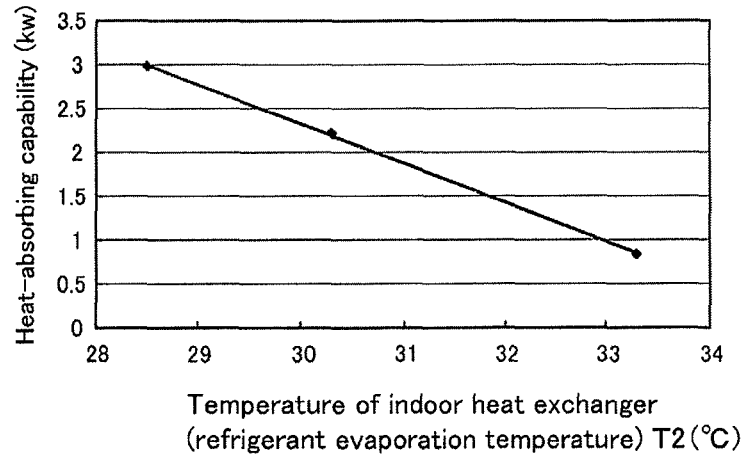
FIG. 3B is a graph showing the relationship between heat-absorbing capability and refrigerant evaporation temperature.

The performance of the indoor heat exchanger 30, that is, the heat absorbing capability of the indoor tubes 31 is evaluated as follows. FIG. 3A shows the relationship between the temperature difference $\Delta T1$(° C.) between input air and output air of the indoor heat exchanger 30 and the heat absorbing capability (kW). FIG. 3B shows the temperature $T2$(° C.) of vaporized refrigerant in the indoor heat exchanger 30. Each of these parameters (measurement values) changes substantially proportionally to the heat absorbing capability of the indoor tubes 31. Accordingly, by measuring one of such parameters in step 73 or 74 and comparing with the parameter in the previous state, that is, the parameter when the outside fan 44 (the fan motor 45) was on or off, it is possible to evaluate the performance (cooling performance) of the indoor heat exchanger unit 30 when the outside fan 44 is on and off.

If, in step 75, the first stopping function 52 finds that the performance (heat absorbing capability, OFF performance) Qoff of the indoor heat exchanger 30 when the outside fan 44 is off is not inferior to the heat absorbing capability (ON performance) Qon when the outside fan 44 is on, that is, if Condition (1) is satisfied, the first stopping functional unit 52 stops the outside fan 44 (the fan motor 45) in step 78.

$$Q\text{on} \leq Q\text{off} \tag{1}$$

When the heat absorbing capability is the same, the outside fan 44 is stopped to suppress the power consumption of the supplementary air conditioning system 11.

When the heat absorbing capability of the indoor heat exchanger 30 is higher when the outside fan 44 is on, the second stopping functional unit 53 further judges whether a difference $\Delta Pw$ in power consumption of the main air conditioning system 20 due to the difference $\Delta Q$ between the heat absorbing capability of the indoor heat exchanger 30 when the outside fan 44 has stopped and the heat absorbing capability of the indoor heat exchanger 30 when the outside fan 44 is running is equal to or below the power consumption of the outside fan 44 (the power consumption of the fan motor 45) Pf.

The difference in performance (difference in heat absorbing capability) $\Delta Q$ can be calculated according to Equation (2) below using the airflow volume V (m³/h), the weight volume ratio γ(kg/m³), the specific heat (kcal/kg° C.), the difference in temperature $\Delta T1$(° C.) between the input air and output air of the indoor heat exchanger unit 30, and a value (1 kW=860 kcal/h) for converting 1 kW to calories (kcal). The airflow volume V is the volume of air that passes the indoor heat exchanger 30 (the indoor tubes 31), and in this example, is the volume of air drawn in by the indoor unit 21.

$$\Delta Q = V \cdot \gamma \cdot Cp \cdot \Delta T1 / (0.86) \tag{2}$$

The difference $\Delta Pw$ in power consumption of the main air conditioning system 20 that includes the indoor unit 21 due to such difference in performance $\Delta Q$ can be calculated according to Equation (3) using the cooling efficiency (or coefficient of performance (COP)) (cooling performance kW/power consumption kW).

$$\Delta Pw = \Delta Q / COP \tag{3}$$

Accordingly, if Condition (4) below is satisfied in step 76, the second stopping functional unit 53 stops the outside fan 44 in step 78. Conversely, if Condition (4) is not satisfied, the outside fan 44 is run in step 77.

$$\Delta Pw \leq Pf \tag{4}$$

Here, Pf is the power consumption of the fan motor 45 that drives the outside fan 44. If there is no difference in power consumption, the motor 45 of the outside fan 44 is stopped to suppress the operating time of the motor 45.

Figure 4:
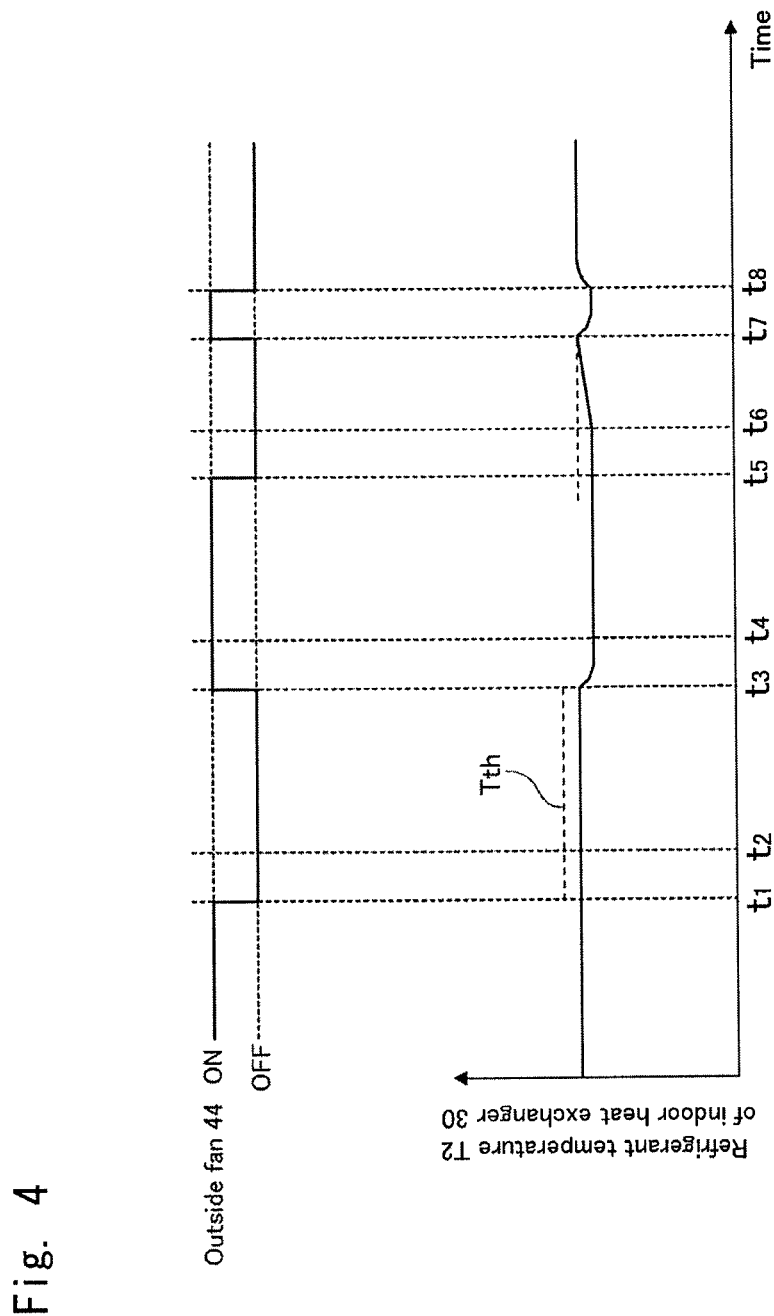
FIG. 4 is a timing chart showing how the air conditioning system operates.

FIG. 4 is a timing chart showing one example of the operation of the supplementary air conditioning system 11. When the evaluation timing is reached at time t1, since the outside fan 44 was running before time t1, the evaluation functional unit 51 stops the outside fan 44 and evaluates the performance (heat absorbing capability) of the internal (interior) heat exchanger unit 30. If the evaluation period has elapsed and there is no change in the heat absorbing capability of the indoor heat exchanger unit 30 at timing t2 in spite of the outside fan 44 having stopped, the first stopping function 52 stops the outside fan 44.

At this time, the evaluation functional unit 51 sets a threshold Tth for re-evaluating the performance of the indoor heat exchanger unit 30, that is, the heat absorbing capability of the indoor tubes 31. For example, if a measurement value for evaluating the performance is the refrigerant evaporation temperature T2, a temperature that is around one degree higher than the evaporation temperature T2 during the evaluation period is set as the threshold Tth. If the measurement value for evaluating the performance is the temperature difference ΔT1, a temperature that is around one degree lower than the temperature difference ΔT1 during the evaluation period is set as the threshold Tth.

At timing t3 when a predetermined period has elapsed from the previous evaluation, since the outside fan 44 was not running before timing t3, the evaluation functional unit 51 runs the outside fan 44 and evaluates the heat absorbing capability of the indoor (interior) heat exchanger unit 30. When the evaluation period has elapsed, if the first stopping functional unit 52 judges at timing t4 that the performance of the indoor heat exchanger unit 30 is higher and the second stopping functional unit 53 further judges that the reduction in power consumption of the main air conditioning system 20 is at least equal to the power consumption of the fan motor 45, the outside fan 44 is run at timing t4 (the running of the outside fan 44 continues).

After time has passed again and the evaluation timing is reached at timing t5, since the outside fan 44 was running before timing t5, the evaluation functional unit 51 stops the outside fan 44 and evaluates the heat absorbing capability of the indoor (interior) heat exchanger unit 30. When the evaluation period has elapsed, if at timing t6 there is no difference in the heat absorbing capability of the indoor heat exchanger unit 30 in spite of the outside fan 44 having stopped, the first stopping functional unit 52 stops the outside fan 44 (i.e., the outside fan 44 is not run).

If the evaporation temperature T2 of the indoor tubes 31 of the indoor heat exchanger unit 30 reaches the threshold Tth at timing t7, even though little time has passed, since the state of the outside air has changed, the evaluation functional unit 51 runs the outside fan 44 and evaluates the heat absorbing capability of the indoor heat exchanger unit 30 (the indoor tubes 31). After the evaluation period has passed, the first stopping functional unit 52 judges at timing t8 that the heat absorbing capability of the indoor heat exchanger unit 30 is higher when the outside fan 44 is running. However, if the second stopping functional unit 53 judges that the difference (in this case, increasing) ΔPw in power consumption of the main air conditioning system 20 is smaller than the power consumption Pf of the fan motor 45, the outside fan 44 is stopped from timing t8 onwards to reduce the overall power consumption of the entire air conditioning system 10.

The air conditioning system 10 that controls the room temperature of the room 1 of this data center includes the main air conditioning system 20 and the supplementary air conditioning system 11 that uses natural circulation and, during the night or in seasons aside from summer where the outside air temperature is low, is able to discharge heat from inside the room 1 using the supplementary air conditioning system 11 using very little or no power at all. Accordingly, the thermal load of the main air conditioning system 20 can be reduced and the power consumption of the air conditioning system 10 that includes the main air conditioning system 20 can be reduced.

In particular, the supplementary air conditioning system 11 according to the present embodiment does not include an indoor fan and also stops the operation of the outdoor fan whenever possible, which makes it possible to discharge heat from inside the room 1 to the outside using the least possible power. This means that the supplementary air conditioning system 11 is capable of cooling the room 1 using outside air temperature as a natural energy source and also using natural winds, such as breezes between buildings, as an energy source. On the other hand, when intermittent energy in the form of wind cannot be used, by driving the outside fan 44, it is possible to improve the usage efficiency of natural energy in the form of outside air. This means that it is possible to reduce power consumption more thoroughly. Also, by reducing the operation ratio of the fan motor 45, it is possible to reduce the cost required for maintenance.

Note that although an example is described above where the indoor heat exchanger (indoor heat exchanger unit) 30 is installed in a room 1 with a ceiling 3 that extends horizontally, it is also possible to install the indoor heat exchanger 30 into a room with a ceiling that is inclined to the horizontal. In such case, the indoor tubes 31 is installed so as to be inclined to or perpendicular (i.e., vertical) to the horizontal. In addition, the indoor tubes 31 should preferably be installed so as to be inclined to the ceiling 3 that is inclined to the horizontal. This makes it easy to provide a sufficient contact area for the high-temperature air zone present across the ceiling 3. The indoor tubes 31 may also be disposed so as to be vertical. However, to suppress a drop in the contact effectiveness between the indoor tubes 31 and high-temperature air due to vertical down streams, the indoor tubes 31 should preferably be installed so as to be inclined to the vertical.

Also, although an example of an air conditioning system installed in a data center has been described above, the cooling load for the present invention is not limited to information equipment such as servers. The air conditioning system according to the present invention is also suited to regulating temperature in conditions where it is not possible to open a window to let in breezes, such as when regulating temperature in a clean room. In addition, although a system according to the present invention has been described for an example where the system is combined with a floor-standing air conditioning system, it is also possible to use the system according to the present invention alone, in combination with another type of air conditioning system, in combination with an existing air conditioning system, or a variety of other methods in accordance with the conditions and environment that require air conditioning.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A system comprising:
an indoor heat exchanger that is a fan-less heat exchanger and includes an indoor tube installed so as to be inclined to the horizontal, the indoor tube contacting a high-temperature air zone in an upper part of a room and refrigerant in the indoor tube being heated by the high-temperature air zone so as to boil and vaporize with air in the high-temperature air zone flowing down through the indoor heat exchanger;
an outdoor heat exchanger that includes an outdoor tube installed outside at a higher position than the indoor tube, the outdoor tube being connected to the indoor tube via connecting pipes without a compressor being interposed therebetween and the outdoor tube condensing and liquefying the refrigerant boiled and vaporized in the indoor tube and returning the refrigerant to the indoor tube;
an outdoor fan that forcibly supplies outdoor air to the outdoor tube; and
a control unit that controls the outdoor fan, the control unit including a functional unit that evaluates a heat absorbing capability of the indoor tube when the outdoor fan is stopped by one of temporarily stopping the outdoor fan and temporarily running the outdoor fan.

2. The system according to the claim 1, wherein the indoor tube is installed so as to be inclined with respect to a ceiling of the room.

3. The system according to the claim 1, wherein the indoor heat exchanger is disposed at one of an air intake of a floor-standing air conditioner installed on a floor of the room, and on an air path to the air intake.

4. The system according to the claim 3, wherein the indoor heat exchanger is connected via a duct to the air intake of the floor-standing air conditioner.

5. The system according to the claim 3, further comprising the floor-standing air conditioner.

6. The system according to the claim 1, wherein the control unit further includes a functional unit that stops the outdoor fan when the heat absorbing capability of the indoor tube when the outdoor fan is stopped is not inferior to the heat absorbing capability of the indoor tube when the outdoor fan is running.

7. The system according to claim 1, wherein the control unit further includes a function unit that stops the outdoor fan when a difference in power consumption of an air conditioner installed in the room due to a difference between the heat absorbing capability of the indoor tube when the outdoor fan is stopped and the heat absorbing capability of the indoor tube when the outdoor fan is running is less than power consumption of the outdoor fan.

8. A method of controlling a system, the system including:
an indoor tube installed so as to be inclined to the horizontal with refrigerant inside the indoor tube being heated by an air zone in a room so as to boil and vaporize;
an outdoor tube installed outside at a higher position than the indoor tube, the outdoor tube being connected to the indoor tube via connecting pipes without a compressor being interposed therebetween, and the outdoor tube condensing and liquefying the refrigerant that has boiled and vaporized in the indoor tube and returning the refrigerant to the indoor tube;
an outdoor fan that forcibly supplies outdoor air to the outdoor tube; and
a control unit that controls the outdoor fan,
the method comprising steps of:
the control unit evaluating a heat absorbing capability of the indoor tube when the outdoor fan is stopped by one of temporarily stopping the outdoor fan and temporarily running the outdoor fan; and
the control unit stopping the outdoor fan if the heat absorbing capability of the indoor tube when the outdoor fan is stopped is not inferior to the heat absorbing capability of the indoor tube when the outdoor fan is running.

9. A method of controlling a system, the system including:
an indoor tube installed so as to be inclined to the horizontal with refrigerant inside the indoor tube being heated by an air zone in a room so as to boil and vaporize;
an outdoor tube installed outside at a higher position than the indoor tube, the outdoor tube being connected to the indoor tube via connecting pipes without a compressor being interposed therebetween, and the outdoor tube condensing and liquefying the refrigerant that has boiled and vaporized in the indoor tube and returning the refrigerant to the indoor tube;
an outdoor fan that forcibly supplies outdoor air to the outdoor tube; and
a control unit that controls the outdoor fan,
the method comprising steps of:
the control unit evaluating a heat absorbing capability of the indoor tube when the outdoor fan is stopped by one of temporarily stopping the outdoor fan and temporarily running the outdoor fan; and
the control unit stopping the outdoor fan if a difference in power consumption of an air conditioner installed in the room due to a difference between the heat absorbing capability of the indoor tube when the outdoor fan is stopped and the heat absorbing capability of the indoor tube when the outdoor fan is running is less than power consumption of the outdoor fan.

\* \* \* \* \*